(12) United States Patent
Greer

(10) Patent No.: US 6,346,469 B1
(45) Date of Patent: Feb. 12, 2002

(54) SEMICONDUCTOR DEVICE AND A PROCESS FOR FORMING THE SEMICONDUCTOR DEVICE

(75) Inventor: Stuart E. Greer, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/476,810

(22) Filed: Jan. 3, 2000

(51) Int. Cl.$^7$ ................................................ H01L 21/44
(52) U.S. Cl. ........................................ 438/614; 257/772
(58) Field of Search ............................... 257/737, 738, 257/743, 772, 751; 438/613, 614, 623, 625, 632, 615, 616, 15, 17, 250

(56) References Cited

U.S. PATENT DOCUMENTS

| 5,130,779 A | * | 7/1992 | Agarwala et al. .............. 357/67 |
| 5,470,787 A | * | 11/1995 | Greer .......................... 438/614 |
| 5,704,116 A | | 1/1998 | Gamota et al. ................ 29/840 |
| 5,937,320 A | | 8/1999 | Andricacos et al. ......... 438/614 |
| 6,011,313 A | * | 1/2000 | Shangguan et al. ......... 257/778 |

OTHER PUBLICATIONS

C. Y. Chang and S. M. Sze, "ULSI Technology", 1996, McGraw–Hill, pp. 208–209, 394–395.*

* cited by examiner

Primary Examiner—Matthew Smith
Assistant Examiner—Calvin Lee
(74) Attorney, Agent, or Firm—George R. Meyer; Patricia S. Goddard

(57) ABSTRACT

Conductive bumps (32) are formed to overlie a semiconductor die (11). The conductive bumps (32) typically have reduced levels of lead, flow at a temperature no greater than 260° C., and have reduced problems associated with alpha particles. In one embodiment, the conductive bump (32) includes a mostly tin (20) with a relatively thin layer of lead (30). The lead (30) and a portion of the tin (20) interact to form a relatively low melting solder close to the eutectic point for lead and tin. Most of the tin (20) remains unreacted and can form a stand off between the semiconductor die (11) and the packaging substrate (42). Other metals and impurities can be used to improve the mechanical or electrical properties of the conductive bumps (32).

20 Claims, 3 Drawing Sheets

US 6,346,469 B1

SEMICONDUCTOR DEVICE AND A PROCESS FOR FORMING THE SEMICONDUCTOR DEVICE

FIELD OF THE INVENTION

The invention relates generally to semiconductor devices and more particularly, to semiconductor devices with conductive bumps and processes for forming them.

RELATED ART

Current environment or health issues regarding packaging typically raise concerns with the use of lead. Many of the current flip chip methods that have conductive bumps typically have a relatively high proportion of lead within the bumps. In one particular type of bump called Controlled Collapsed Chip Connection (C4), the bumps typically have approximately 97 weight percent lead and approximately 3 weight percent tin. These bumps cause three different problems. First, they have more lead than many customers like to have. Secondly, a relatively high temperature is needed to flow the bumps, and thirdly, the use of lead typically causes alpha particle generation for the semiconductor device.

In an attempt to reduce the high temperature flow, Evaporated Extended Eutectic bumps (E3) have been used to reduce the flow temperature. In this particular embodiment, a bump typically includes a relatively thin layer of tin under a relatively thick, mostly lead layer, and capped with a relatively thin layer of tin. During the flow process, the tin and lead, at a point distal to the die, flow relatively easily at a temperature no greater than approximately 200° C. to make a good chip connection at a relatively low temperature. The problems with the E3 bumps are that they still have too much lead and have problems with alpha particles.

In an attempt to reduce the alpha particle problem, an idea has been generated to use two different types of lead. The lower lead layer has very few impurities and is covered by a typical commercial lead layer. The problem with this is that during the heat and flow, some of the lead and impurities from the commercial layer may migrate to the lower lead layer. Therefore, the alpha particle reduction may not be very significant. Further, it also suffers from the same two problems with the C4 bumps, such as too much lead and too high of a flow temperature.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Conductive bumps are formed to overlie a semiconductor die. The conductive bumps typically have reduced levels of lead, flow at a temperature no greater than 260° C., and have reduced problems associated with alpha particles. In one embodiment, the conductive bump includes a mostly tin with a relatively thin layer of lead. The lead and a portion of the tin interact to form a relatively low melting solder close to the eutectic point for lead and tin. Most of the tin remains unreacted and can form a stand off between the semiconductor die and the packaging substrate. Other metals and impurities can be used to improve the mechanical or electrical properties of the conductive bumps. The present invention is defined by the claims and is better understood after reading the description of the embodiments.

Figure 1:
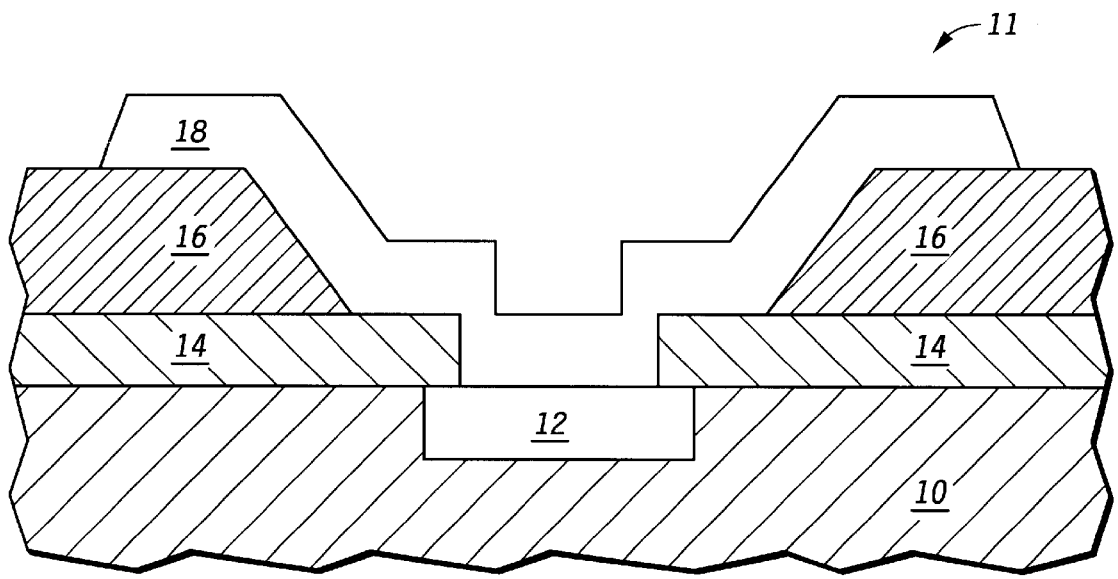
FIG. 1 includes an illustration of a portion of a semiconductor die after forming an underbump metallurgy.

FIG. 1 includes an illustration of a cross-sectional view of a portion of the semiconductor die 11. As illustrated in FIG. 1, the semiconductor die 11 includes an insulating layer 10. Insulating layer 10 includes nitride, oxide, oxynitride, or a combination thereof. Formed within the insulating layer 10 is a semiconductor die interconnect pad 12. The pad 12 has a conductive fill material including as mostly aluminum, copper, tungsten or the like. As used herein, mostly is defined as at least half. Also formed, but not shown with the interconnect pad 12, is an adhesion or barrier layer typically formed before depositing the conductive fill material. After forming the interconnect pad 12, a passivation layer 14 is then formed over the insulating layer 10 and pad 12. An opening is formed through the passivation layer 14 to form an opening that exposes a position of the die interconnect pad 12.

An optional scratch protection or alpha protection layer 16 is then formed over the passivation layer 14. The layer 16 typically includes a material, such as polyimide and the like. An underbump metallurgy layer 18 is then formed over the polyimide layer portions of the passivation layer 14 and is in contact with die interconnect pad 12. The underbump metallurgy layer 18 typically includes a plurality of films, such as chrome, copper, titanium, tantalum, gold, platinum, palladium, nickel, cobalt, iron, alloys of those materials, and combinations with possibly other different metals. It can also include a metal nitride to improve barrier properties, if needed. The thickness of the underbump metallurgy typically is no greater than approximately one micron.

Figure 2:
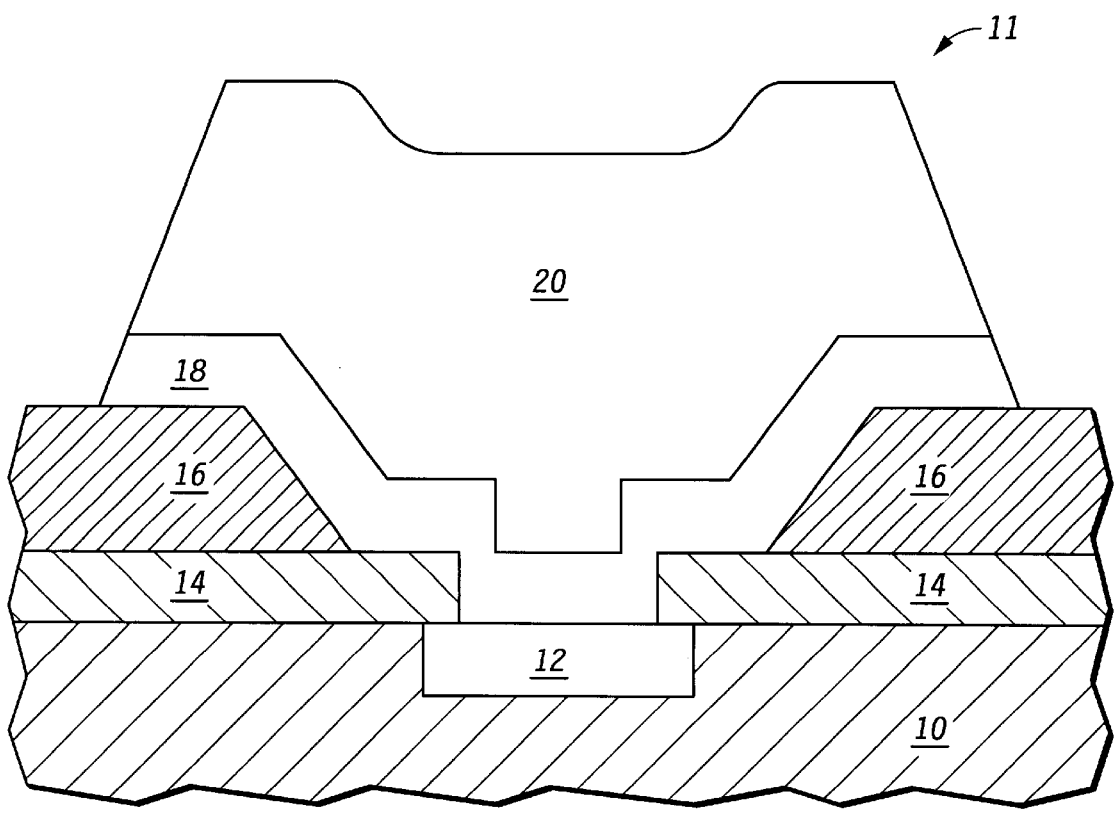
FIG. 2 includes an illustration of a cross-sectional view of the substrate of FIG. 1 after forming a first metal layer for the bump.

The main portion of the bump is then formed over the underbump metallurgy layer 18. The main portion of the bump includes a first metallic layer 20 as seen in FIG. 2. In this particular embodiment, the layer 20 is all or nearly all tin and has a thickness in the range of approximately 25 to 75 microns. The method for forming layer 20 can include physical vapor deposition, evaporation, plating (electroplating or electroless plating), or the like. In addition to tin, another material can be used, such as aluminum and the like. The first metallic layer 20 may include impurities to improve the mechanical or electrical properties of the material. Examples of impurities include copper, silver, indium, bismuth, antimony, zinc, or the like. In another embodiment, the first metallic layer 20 can include a conductive alloy that includes at least two different conductive elements. In order to avoid the problems with lead, the first metallic layer 20 should not include any lead.

Figure 3:
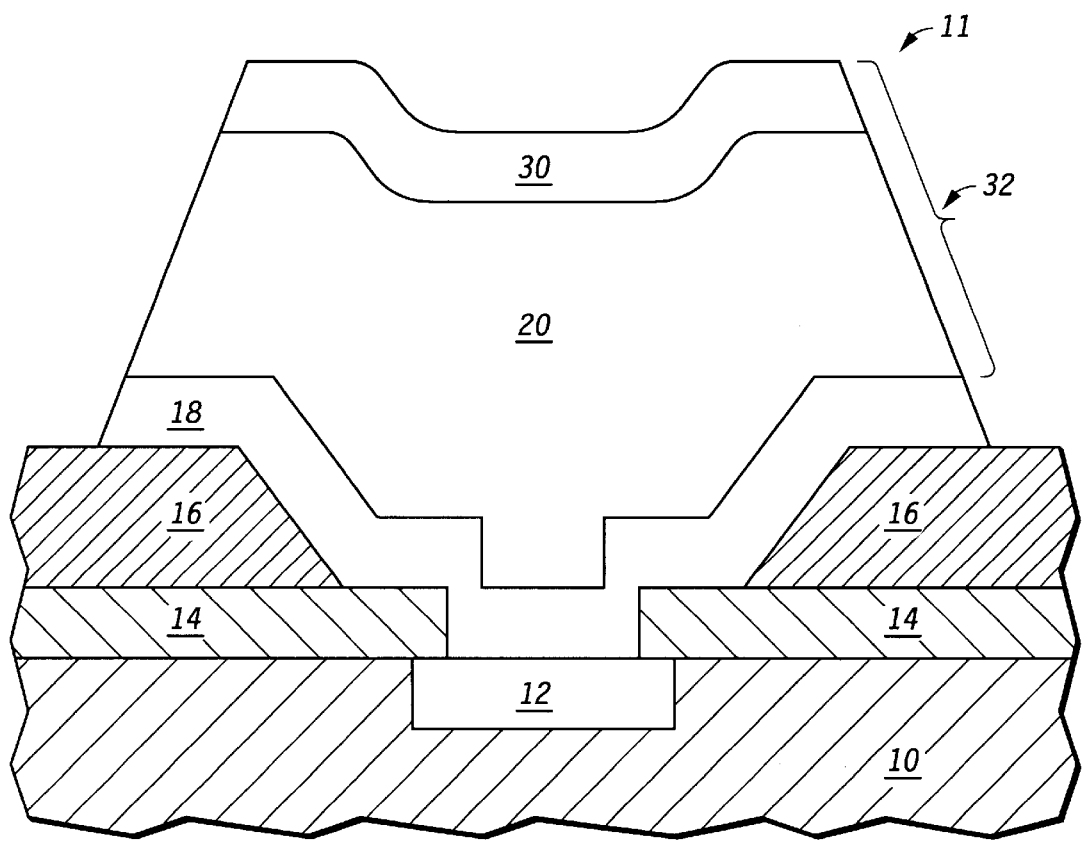
FIG. 3 includes an illustration of a cross-sectional view of the substrate of FIG. 2 after forming a second metal layer that caps the first metal layer in forming the bump.

A second metallic layer 30 is then formed over the first metallic layer 20 as illustrated in FIG. 3. The second metallic layer 30 can be formed using any of the methods described for the first metallic layer 20. Note that the first and second metallic layers 20 and 30 may be formed using different methods. Returning to FIG. 3, in this particular embodiment, the second metallic layer 30 includes all or nearly all lead and has a thickness in range of approximately 1 to 25 microns. In addition to lead, another material could be used, such as gold, bismuth, indium, silver, gallium, or the like.

At this point, a conductive bump 32 has been formed and includes the first metallic layer (a first portion) 20 and the second metallic layer (a second portion) 30. In one particular embodiment, the conductive bump 32 has some interesting characteristics. The conductive bump 32 has at least 2 weight percent lead and typically will be less than approximately 25 weight percent lead. Clearly, the conductive bump 32 has more tin than lead. The first metallic layer 20 is at least approximately three times thicker than the second metallic layer 30. The second metallic layer 30 is the layer lying farthest from the semiconductor die 11.

Figure 4:
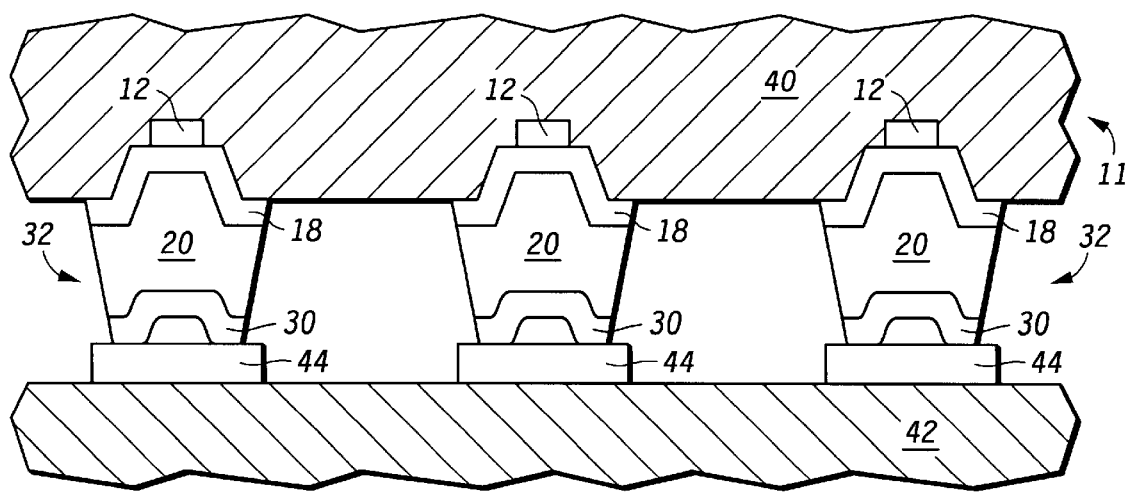
FIG. 4 includes an illustration of a cross-sectional view of portions of a packaging substrate and semiconductor die during a placement of the bumps onto the packaging substrate.
Figure 5:
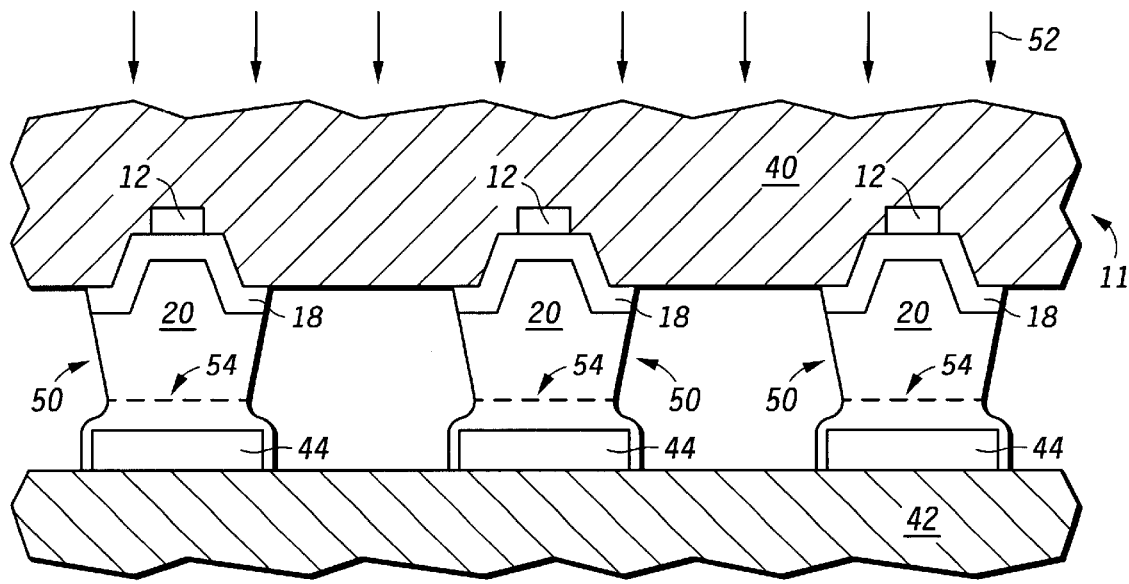
FIG. 5 includes an illustration of a cross-sectional view of the substrate of FIG. 4 while flowing the bumps.
Figure 6:
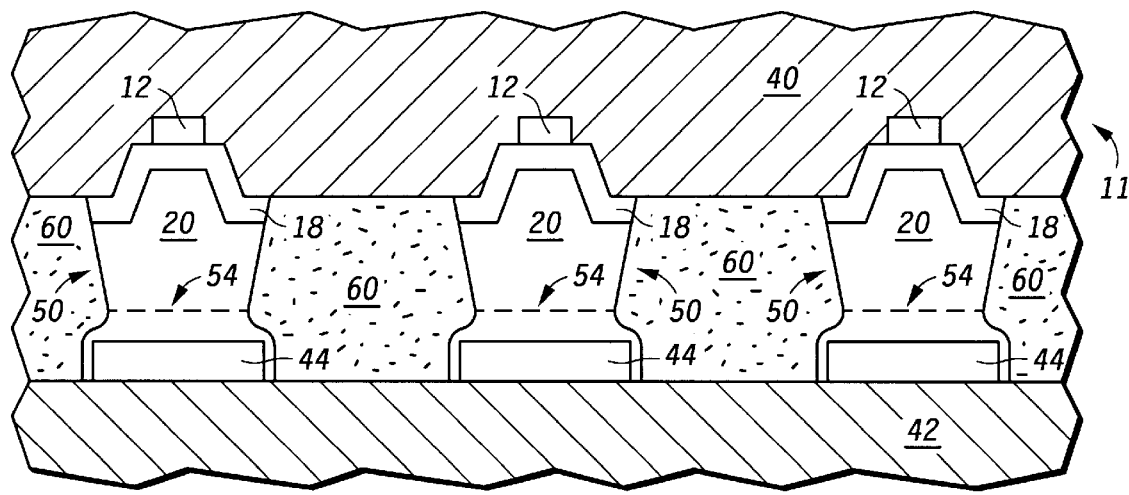
FIG. 6 includes an illustration of a cross-sectional view of the substrate of FIG. 5 after forming an underfill material between the semiconductor die and the packaging substrate.

The semiconductor die 11 including a plurality of the bumps are attached to packaging substrate as illustrated in FIGS. 4–6. Turning to FIG. 4, the insulating layers 10, 14, and 16 (from FIGS. 1–3) are illustrated by one reference element 40, and the semiconductor die also includes the semiconductor die interconnect pad 12 and the bumps 32 as previously described. The packaging substrate 42 typically includes at least a portion of an organic material. In one embodiment, the packaging substrate is nearly all organic material(s) other than the packaging substrate interconnect pads 44 and other interconnects (not shown) within the packaging substrate 42. In another embodiment, the packaging substrate can include a mostly ceramic substrate that has a relatively thin organic layer on its exposed surface facing the semiconductor die 11. The organic layer has the wiring or other pads and interconnects along the exposed edge of that organic film.

Before placing the die 11 onto the packaging substrate 42, typically the packaging substrate 42 and the package pads 44 are exposed to a flux. This flux typically includes organic acid(s) that can react with oxides that form along the surface of the pads 44. An example is a carboxylic acid including adipic acid, citric acid, maleic acid, abietic acid, or the like. In one particular embodiment, a no-clean flux may be used. With a no-clean flux, a relatively thin layer of flux can be applied without the necessity of having to do a cleaning step after joining the die 11 to the packaging substrate 42. In one particular embodiment, an adhesive promoting material, such as camphor, can be used to improve adhesion between the bumps 32 and the pads of the packaging substrate 42. After the flux has been applied, the die 11 is then place onto the packaging substrate 42 such that the bumps 32 contact the pads 44. A slight amount of pressure is applied to allow the bumps 32 to adhere better to the package pads 44. Typically, 0.07 to 0.10 newton of force is applied to allow sufficient adhesion such that the die and packaging substate 42 do not readily separate during routine handling.

After placing the bumps 32 onto the pads 44, the combined assembly is then subjected to a thermal cycle that causes solder to form and bond with the bumps 32 to the pads 44. As illustrated in FIG. 5, the heat is generally illustrated by the arrows 52 and typically is performed at a temperature of at least approximately 183° C. Often, this operation is performed at a temperature no greater than approximately 201° C. However, in other embodiments, higher temperatures can be used. The melting point of tin is approximately 231° C. Therefore, the flow should not be performed at a temperature any higher than approximately 231° C. to reduce the likelihood that the tin will flow. Due to presence of the organic substrate, the flowing temperature is typically no higher than approximately 260° C. if other materials are used for the first and second metallic layers.

In the proximity where the first and second metallic layers 20 and 30 reside, the temperature allows an interaction between the lead and tin within those layers to form a material that has a suppressed melting point closer to the eutectic point of tin and lead, which is approximately 183° C. (within a range of approximately 180–190° C.) when the composition is approximately 63 weight percent tin and approximately 37 weight percent lead. As illustrated in FIG. 5 the border between the suppressed melting point portion and the balance of the first metallic layer 20 is illustrated by the dashed line 54. Although this is not clearly discernible or discrete transition between the two portions, this generally illustrates where the border is. In this particular embodiment, the solder flows onto and along the sides of the pads 44, but continues to provide a stand-off gap due to the unmelted portion of the first metallic layer.

A layer of underfill material 60 is then placed between the die substrate 40 and the packaging substate 42. This laterally surrounds the bumps 50 and allows better mechanical integrity of the assembled part. The underfill material typically includes alumina, silica, or the like, within an epoxy mixture.

In other embodiments during the packaging substrate attachment act, other embodiments are possible. For example, no flux is necessary in order to do the bonding and likewise the use of adhesion promoting agents, such as camphor are not necessary.

Embodiments of the present invention include benefits that are not achieved by the prior art. More specifically, the lead tin materials for the first and second metallic layers in at least some of the embodiments allow a relatively low melting point material closer to the eutectic point for lead and tin to be formed, which allows a flowing step to be performed below or no greater than approximately 200° C. In some embodiments, the flow temperature can be taken to a higher point if the melting point of the first metallic layer is higher than that of the eutectic that would be melting. Second, the amount of lead is greatly reduced. Typically, there is no more than approximately 25 weight percent lead within the conductive bumps. Further, because the lead is displaced further from the semiconductor die substrate, the likelihood of alpha particle problems is significantly reduced. The first metallic layer 20 is a standoff during the flowing operation. Because the temperature of the flowing operation is typically performed below the melting point of the first metallic layer, the first metallic layer 20 does not melt, other than the portion that forms the solder portion of the bump. Even after the flowing operation, the remaining portion of the first metallic layer 20 is still at least approximately three thicker than the thickness of the solder portion, when the solder portion thickness is measured normal to a surface (sides or top) of the packaging interconnect pad 44.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a semiconductor die comprising:
   forming a die interconnect pad over a semiconductor device substrate; and
   forming a conductive bump over and electrically connected to the die interconnect pad, wherein:
      the conductive bump includes a first metallic layer and a second metallic layer, wherein:
         the first metallic portion lies closer to the semiconductor die compared to the second metallic portion, is a main portion of the conductive bump, and does not substantially include lead; and
         the second metallic portion is a farthest metallic portion of the conductive bump with respect to the semiconductor die, and wherein the second metallic portion includes lead.

2. The process of claim 1, wherein the conductive bump is formed using electroplating.

3. The process of claim 1, wherein the conductive bump is formed using evaporation.

4. The process of claim 1, wherein the conductive bump is formed using physical vapor deposition.

5. The process of claim 1, further comprising forming an underbump layer over the die interconnect pad and before forming the conductive bump.

6. The process of claim 1, wherein at least one of the first and second metallic layers includes an alloy during its formation.

7. A process for forming a semiconductor die comprising:
   placing a semiconductor die and a substrate in contact with each other, wherein:
      the semiconductor includes a die interconnect pad and a conductive bump including a first metallic layer and a second metallic layer;
      the first metallic layer lies closer to the semiconductor die compared to the second metallic layer, is a main portion of the conductive bump and does not substantially include lead; and
      the second metallic portion is a farthest metallic portion of the conductive bump with respect to the semiconductor die and includes lead; and
   flowing a portion, but not all, of the conductive bump.

8. The process of claim 7, wherein flowing is performed at a temperature lower than a melting point of the first metallic layer.

9. The process of claim 7, wherein the flowing is performed at a temperature no greater than approximately 260° C.

10. The process of claim 7, wherein the first metallic layer has a melting point of at least approximately 201° C.

11. The process of claim 7, wherein the substrate includes an organic portion.

12. The process of claim 7, wherein the first metallic layer is thicker than the second metallic layer, and wherein the second metallic layer is a farthest metallic layer of the conductive bump with respect to the semiconductor die, and wherein the second metallic layer includes lead.

13. A process for forming a semiconductor die comprising:
   forming a die interconnect pad over a semiconductor device substrate; and
   forming a conductive bump over and electrically connected to the die interconnect pad, wherein:
      the conductive bump includes a first metallic layer and a second metallic layer, wherein:
         the first metallic portion lies closer to the semiconductor die compared to the second metallic portion;
         the first metallic portion and the second metallic portion are of different materials;
         the second metallic portion contains lead; and
         the conductive bump includes less than approximately 25 weight percent lead.

14. The process of claim 13, wherein the conductive bump is formed using electroplating.

15. The process of claim 13, wherein the conductive bump is formed using evaporation.

16. The process of claim 13, wherein the conductive bump is formed using physical vapor deposition.

17. A process for forming a semiconductor die comprising:
   placing a semiconductor die and a substrate in contact with each other, wherein:
      the semiconductor includes a die interconnect pad and a conductive bump including a first metallic layer and a second metallic layer, wherein:
         the first metallic portion lies closer to the semiconductor die compared to the second metallic portion;
         the first metallic portion and the second metallic portion are of different materials;
         the second metallic portion contains lead; and
         the conductive bump includes less than approximately 25 weight percent lead; and
   flowing a portion, but not all, of the conductive bump.

18. The process of claim 17, wherein flowing is performed at a temperature lower than a melting point of the first metallic layer.

19. The process of claim 17, wherein the substrate includes an organic portion.

20. The process of claim 17, wherein the first metallic layer is thicker than the second metallic layer.

* * * * *